United States Patent
Kamioka et al.

(10) Patent No.: US 7,396,721 B2
(45) Date of Patent: Jul. 8, 2008

(54) METHOD OF FABRICATING A SEMICONDUCTOR DEVICE

(75) Inventors: Isao Kamioka, Tokyo (JP); Yoshio Ozawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 373 days.

(21) Appl. No.: 11/130,128

(22) Filed: May 17, 2005

(65) Prior Publication Data
US 2006/0166428 A1   Jul. 27, 2006

(30) Foreign Application Priority Data
Jan. 24, 2005   (JP)   ............... 2005-015415

(51) Int. Cl.
H01L 21/336   (2006.01)
(52) U.S. Cl. ............... 438/257; 257/E21.209
(58) Field of Classification Search ........ 438/257, 438/795; 257/E21.209
See application file for complete search history.

(56) References Cited

U.S. PATENT DOCUMENTS 6,048,766 A * 4/2000 Gardner et al. ............. 438/257
2007/0025145 A1 * 2/2007 Mokhlesi et al. ....... 365/185.01

OTHER PUBLICATIONS

Ozawa, et al., "Nonvolatile Semiconductor Memory and Manufacturing Method for the Same", U.S. Appl. No. 10/724,103, filed Dec. 1, 2003.
Lee et al, "A Novel High K Inter-Poly Dielectric (IPD), $Al_2O_3$ for Low Voltage/High Speed Flash Memories: Erasing in msecs at 3.3V," Symposium on VLSI Technology digest of Technical Papers (1997), pp. 117-118.

* cited by examiner

Primary Examiner—Bradley K Smith
(74) Attorney, Agent, or Firm—Finnegan, Henderson, Farabow, Garrett & Dunner, L.L.P.

(57) ABSTRACT

According to the present invention, there is provided a semiconductor device fabrication method comprising:
forming a first insulating film on a semiconductor substrate;
forming a first conductive layer on the first insulating film;
forming a second insulating film on the first conductive layer in a first processing chamber isolated from an outside;
performing a modification process on the second insulating film in the first processing chamber, and unloading the semiconductor substrate from the first processing chamber to the outside;
annealing the second insulating film in a second processing chamber; and
forming a second conductive layer on the second insulating film.

18 Claims, 13 Drawing Sheets

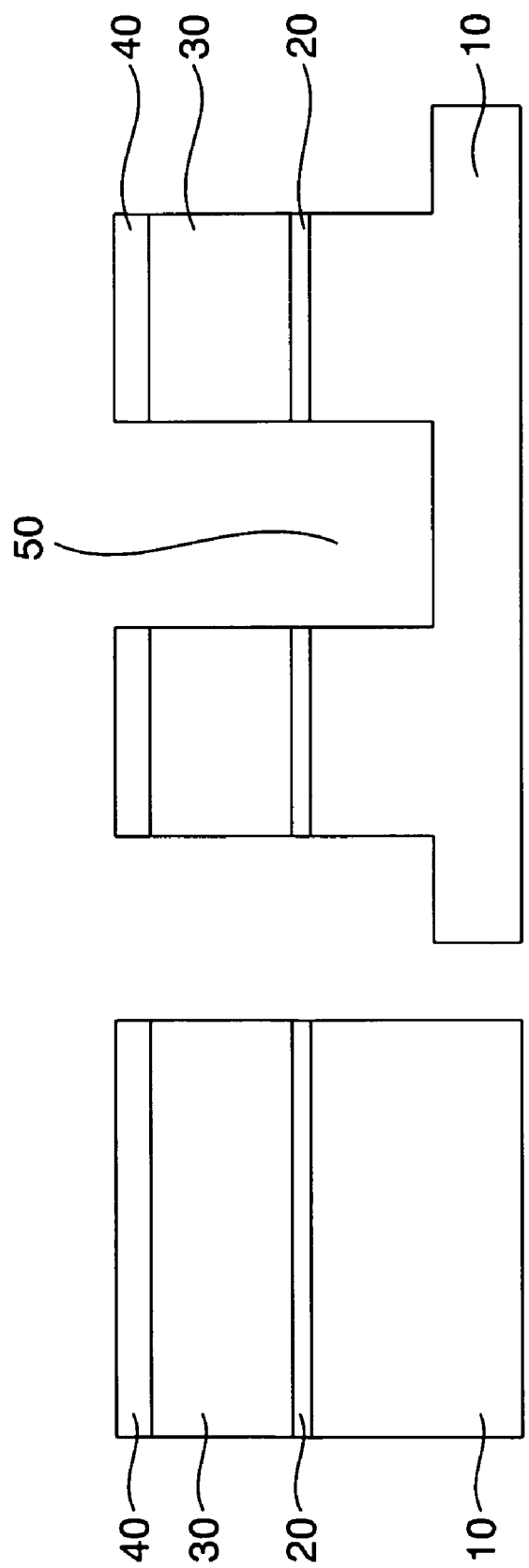

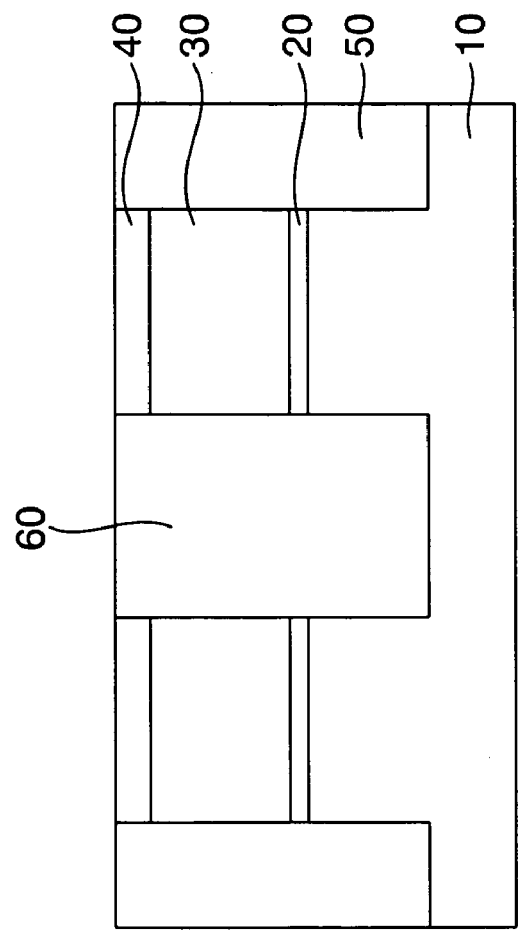
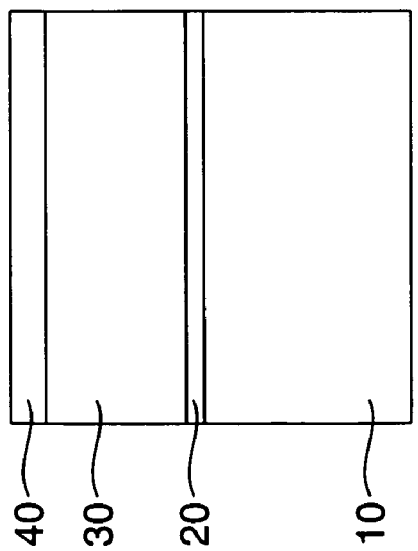
FIG. 2B
FIG. 2A

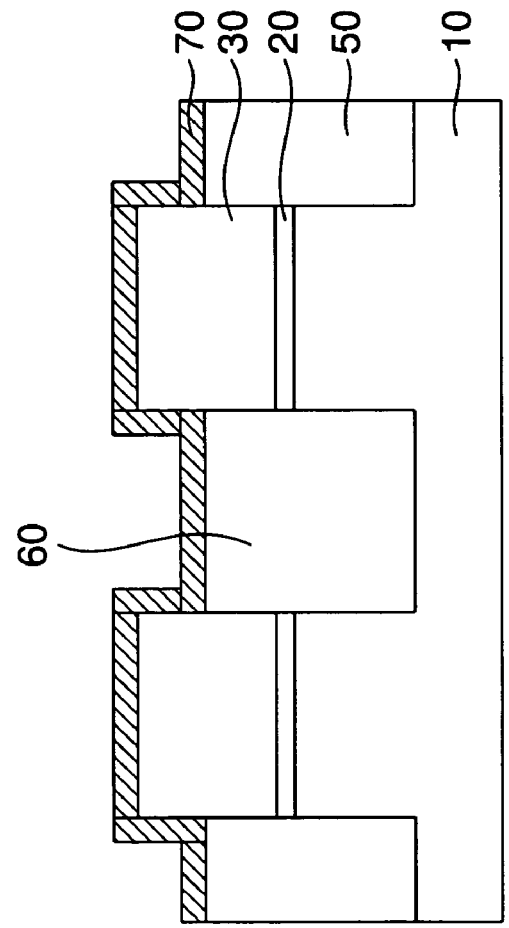
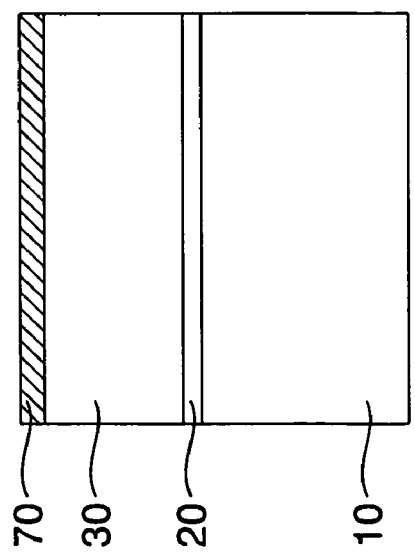

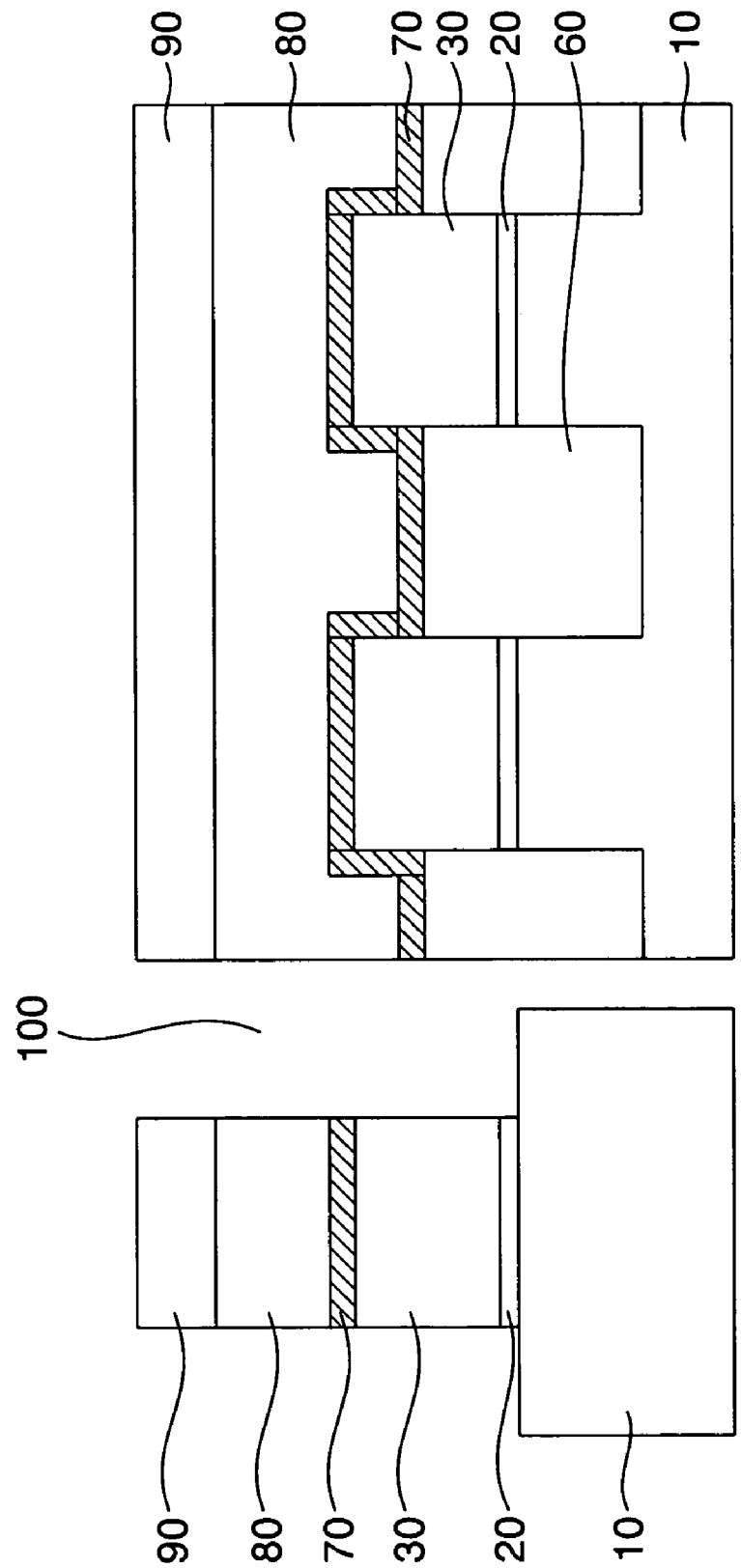

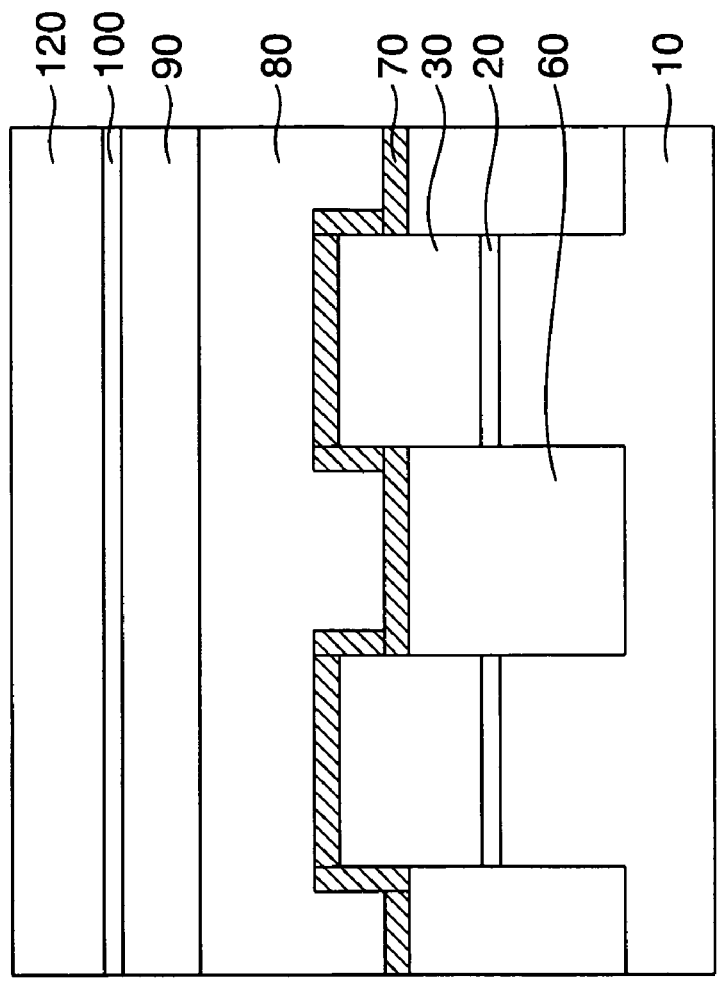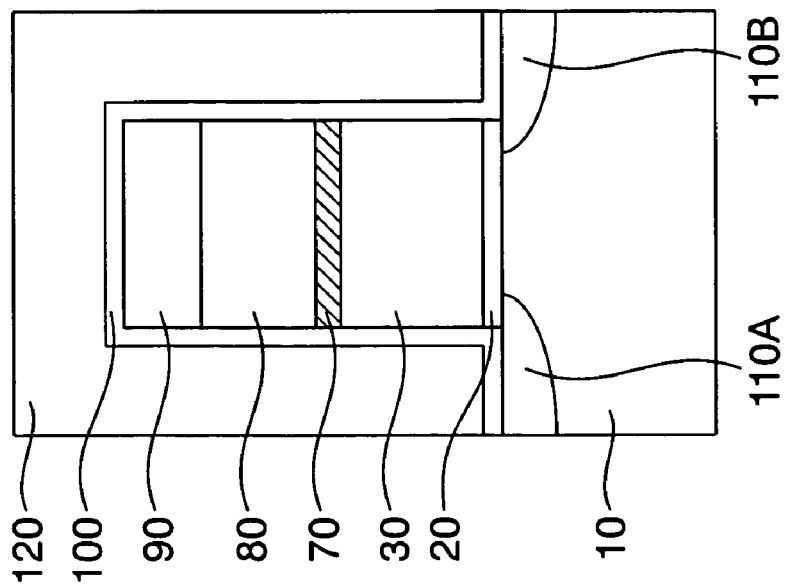
FIG. 5B
FIG. 5A

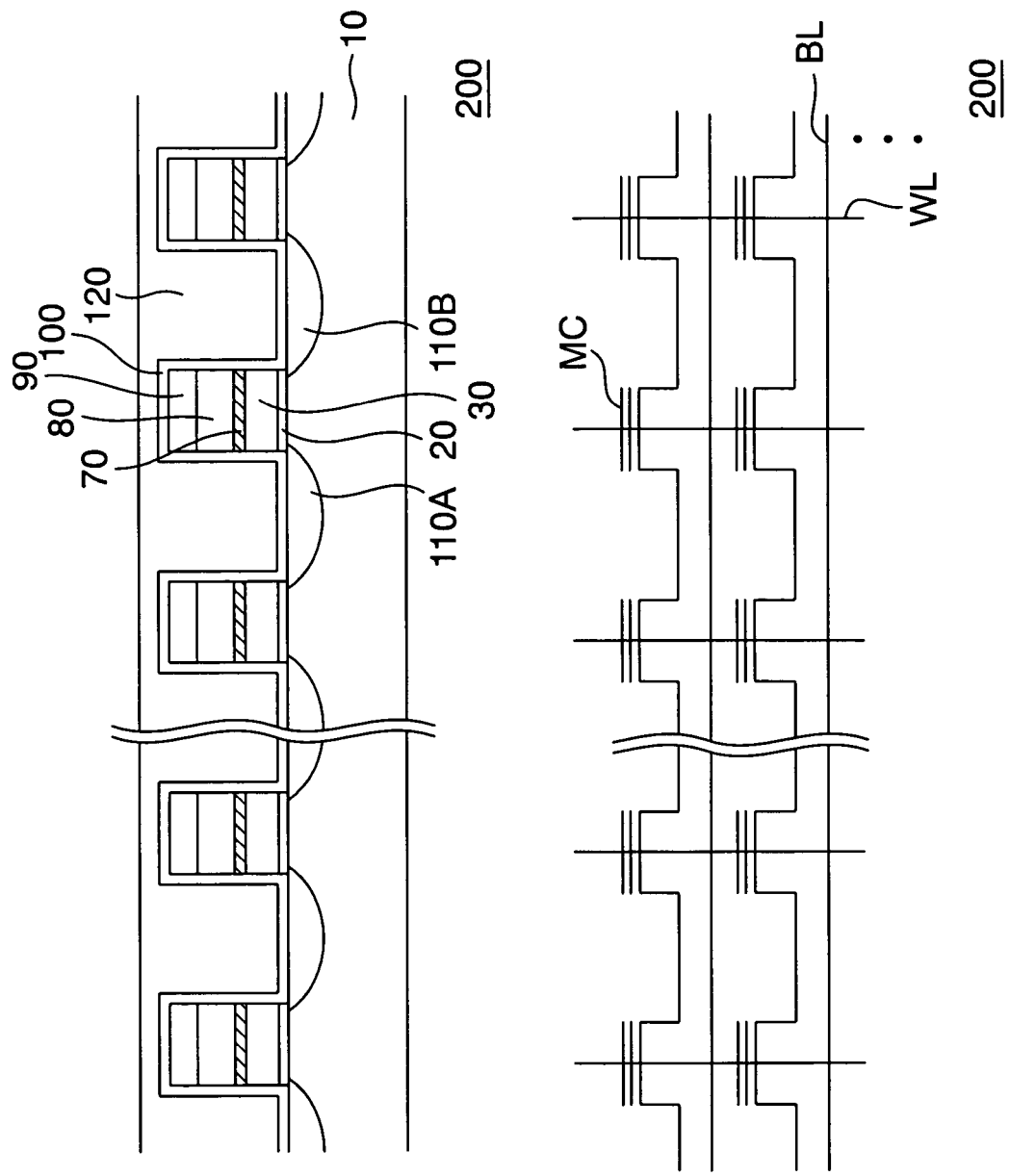

US 7,396,721 B2

METHOD OF FABRICATING A SEMICONDUCTOR DEVICE

CROSS REFERENCE TO RELATED APPLICATION

This application is based upon and claims benefit of priority under 35 USC §119 from the Japanese Patent Application No. 2005-15415, filed on Jan. 24, 2005, the entire contents of which are incorporated herein by reference.

BACKGROUND OF THE INVENTION

The present invention relates to a semiconductor device and a method of fabricating the same.

Conventionally, a NAND flash memory has been developed as a nonvolatile semiconductor memory. A memory cell transistor of this NAND flash memory has a structure in which a floating gate electrode formed on a semiconductor substrate via a tunnel insulating film and a control gate electrode formed on this floating gate electrode via an inter-electrode insulating film are stacked.

Recently, to decrease the cell size, a method of using an alumina ($Al_2O_3$) film, instead of the conventional ONO film (a stacked film in which a silicon oxide film, silicon nitride film, and silicon oxide film are stacked), as an inter-electrode insulating film is proposed (reference 1).

Since the alumina ($Al_2O_3$) film is a high-dielectric-constant film having a relative dielectric constant higher than that of the ONO film, the area of the inter-electrode insulating film can be reduced. As a consequence, the cell size can be decreased.

The NAND flash memory stores "1" data in the memory cell transistor by discharging electrons from the floating gate electrode to the semiconductor substrate, and stores "0" data in the memory cell transistor by injecting electrons into the floating gate electrode from the semiconductor substrate.

Unfortunately, the density of a high-dielectric-constant film is low. Therefore, if a high-dielectric-constant film is used as the inter-electrode insulating film, electrons injected into the floating gate electrode from the semiconductor substrate by applying an electric field of a predetermined level between the control gate electrode and semiconductor substrate penetrate through the inter-electrode insulating film. This increases a leakage current flowing through the control gate electrode.

To prevent this, therefore, it is necessary to suppress the leakage current by performing a predetermined heating process (annealing) for a high-dielectric-constant film deposited on a conductive layer serving as the floating gate electrode, thereby modifying the high-dielectric-constant film.

The reference concerning the use of the alumina ($Al_2O_3$) film as the inter-electrode insulating film is as follows.

Reference 1: Symposium on VLSI Technology Digest of Technical Papers, p. 117, 1997

SUMARY OF THE INVENTION

According to one aspect of the invention, there is provided a semiconductor device fabrication method comprising:

forming a first insulating film on a semiconductor substrate;

forming a first conductive layer on the first insulating film;

forming a second insulating film on the first conductive layer in a first processing chamber isolated from an outside;

performing a modification process on the second insulating film in the first processing chamber, and unloading the semiconductor substrate from the first processing chamber to the outside;

annealing the second insulating film in a second processing chamber; and forming a second conductive layer on the second insulating film.

According to one aspect of the invention, there is provided a semiconductor device fabrication method comprising:

loading a semiconductor substrate into a first processing chamber isolated from an outside, and forming an insulating film on a surface of the semiconductor substrate in the first processing chamber;

performing a modification process on the insulating film in the first processing chamber, and unloading the semiconductor substrate from the first processing chamber to the outside;

annealing the insulating film in a second processing chamber; and forming a conductive layer on the insulating film.

BRIEF DESCRIPTION OF THE DRAWINGS

FIGS. 1A and 1B are longitudinal sectional views each showing the sectional structure of elements in one step of a method of fabricating a NAND flash memory according to the first embodiment of the present invention;

FIGS. 2A and 2B are longitudinal sectional views each showing the sectional structure of elements in one step of the method of fabricating the NAND flash memory;

FIGS. 3A and 3B are longitudinal sectional views each showing the sectional structure of elements in one step of the method of fabricating the NAND flash memory;

FIGS. 4A and 4B are longitudinal sectional views each showing the sectional structure of elements in one step of the method of fabricating the NAND flash memory;

FIGS. 5A and 5B are longitudinal sectional views each showing the sectional structure of elements in one step of the method of fabricating the NAND flash memory;

FIGS. 6A and 6B are longitudinal sectional views each showing the sectional structure of elements in one step of the method of fabricating the NAND flash memory;

DETAILED DESCRIPTION OF THE INVENTION

Figure 7:
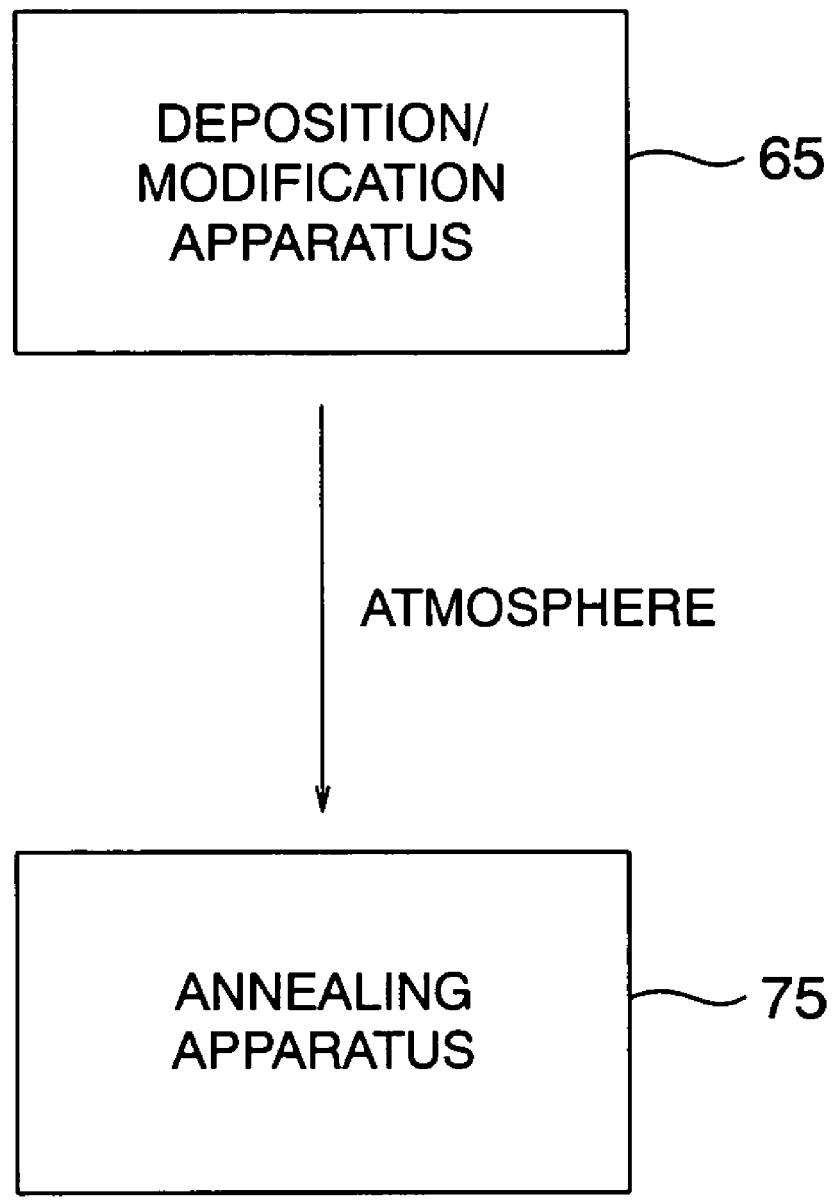
FIG. 7 is a block diagram showing the arrangement of a batch type deposition/modification apparatus and annealing apparatus.

Embodiments of the present invention will be described below with reference to the accompanying drawings.

(1) First Embodiment

FIGS. 1A to 6B show a method of fabricating a memory cell transistor of a NAND flash memory according to the first embodiment of the present invention. Of FIGS. 1A to 5B, each of FIGS. 1A, 2A, 3A, 4A, and 5A is a longitudinal sectional view, cut along a bit line, of elements in a predetermined step, and each of FIGS. 1B, 2B, 3B, 4B, and 5B is a longitudinal sectional view, cut along a word line, of elements in a predetermined step.

First, as shown in FIGS. 1A and 1B, a silicon oxynitride (SiON) film 20 about 10 nm thick serving as a tunnel insulating film is formed by thermal oxidation and thermal nitriding on a semiconductor substrate 10 into which a predetermined impurity is doped. After that, a phosphorous (P)-doped polysilicon layer 30 serving as a floating gate electrode is deposited by CVD (Chemical Vapor Deposition), and a mask material 40 is formed by coating. Note that any of various impurities such as arsenic (As) may also be doped, in place of phosphorus (P), into the polysilicon layer 30.

The mask material 40, polysilicon layer 30, and silicon oxynitride (SiON) film 20 are sequentially patterned by lithography and RIE (Reactive Ion Etching). In addition, the mask material 40 is used as a mask to etch the semiconductor substrate 10, thereby forming an element isolation trench 50 about 100 nm deep from the surface of the semiconductor substrate 10.

As shown in FIGS. 2A and 2B, a silicon oxide film 60 is deposited on all the surfaces of the semiconductor substrate 10 and mask material 40 so as to fill the element isolation trench 50. After that, the silicon oxide film 60 is planarized by polishing its surface by CMP (Chemical Mechanical Polishing), thereby forming a silicon oxide film 60 as an element isolation insulating film.

As shown in FIGS. 3A and 3B, a predetermined amount of the surface portion of the silicon oxide film 60 is etched to be removed by using a dilute hydrofluoric acid solution to expose the side surfaces of the polysilicon layer 30 by about 50 nm. The exposed mask material 40 is then selectively removed.

In addition, dilute hydrofluoric acid is used to remove a natural oxide film formed on the surface of the polysilicon layer 30. After that, the semiconductor substrate 10 is loaded into a batch type deposition/modification apparatus 65 shown in FIG. 7 which is a processing chamber having a single processing vessel and is called a furnace. In the deposition/modification apparatus 65, an alumina ($Al_2O_3$) film 70 serving as an inter-electrode insulating film is deposited on all the surfaces of the silicon oxide film 60 and polysilicon layer 30 at a temperature of 400° C. Note that the deposition/modification apparatus 65 has an exhausting mechanism and gas supply source (neither is shown), and can form a desired ambient by using them.

In this embodiment, the alumina ($Al_2O_3$) film 70 is deposited as an inter-electrode insulating film. However, it is also possible to deposit any of various high-dielectric-constant films having a relative dielectric constant of 4 or more. Examples are oxide films such as hafnia ($HfO_2$), zirconia ($ZrO_2$), hafnium silicate (HfSiO), and zirconium silicate (ZrSiO), and oxide films obtained by doping an impurity into these oxide films.

When the alumina ($Al_2O_3$) film 70 which is a high-dielectric-constant film is used as an inter-electrode insulating film as in this embodiment, it must be densified by high-temperature annealing in order to suppress a leakage current in it.

Unfortunately, the deposition/modification apparatus 65 in which the alumina ($Al_2O_3$) film 70 is deposited cannot perform this high-temperature annealing. Therefore, it is necessary to once remove the semiconductor substrate 10 from the deposition/modification apparatus 65, load the semiconductor substrate 10 into an annealing apparatus 75 shown in FIG. 7 which can perform high-temperature annealing, and densify the alumina ($Al_2O_3$) film 70 by high-temperature annealing in the annealing apparatus 75.

If, however, the semiconductor substrate 10 is exposed to the atmosphere after being removed from the deposition/modification apparatus 65 and before being loaded into the annealing apparatus 75, the alumina ($Al_2O_3$) film 70 absorbs water.

If the alumina ($Al_2O_3$) film 70 which has absorbed water is annealed, a low-dielectric-constant silicon oxide film is formed in the interface between the polysilicon layer 30 and alumina ($Al_2O_3$) film 70. This poses the problem that the effective relative dielectric constant of the alumina ($Al_2O_3$) film 70 lowers.

In this embodiment, therefore, in the deposition/modification apparatus 65 in which the alumina ($Al_2O_3$) film 70 is deposited, the alumina ($Al_2O_3$) film 70 is annealed in a nitrogen ambient at a temperature of, e.g., 800° C. for 60 min, thereby modifying, e.g., densifying the alumina ($Al_2O_3$) film 70 to such an extent that it does not absorb water when the semiconductor substrate 10 is exposed to the atmosphere.

Note that the temperature of this annealing need only be, e.g., 600° C. to 900° C. which is higher than the temperature when the alumina ($Al_2O_3$) film 70 is deposited. However, the temperature is desirably as high as possible because the densifying effect improves. Annealing may also be performed in an oxidizing ambient, and the annealing time may also be about 30 min.

After that, the semiconductor substrate 10 is removed from the deposition/modification apparatus 65, and loaded into the annealing apparatus 75 shown in FIG. 7. Although the semiconductor substrate 10 is exposed to the atmosphere during this transfer, it is possible to suppress the alumina ($Al_2O_3$) film 70 from absorbing water, i.e., suppress moisture absorption by the alumina ($Al_2O_3$) film 70.

In the annealing apparatus 75, the alumina ($Al_2O_3$) film 70 is annealed in an oxidizing ambient at, e.g., about 1,035° C. which is higher than the temperature of annealing for suppressing moisture absorption by the alumina ($Al_2O_3$) film 70, without performing any liquid chemical treatment for avoiding moisture absorption by the alumina ($Al_2O_3$) film 70, thereby densifying the alumina ($Al_2O_3$) film 70 to such an extent that the leakage current in it can be suppressed. After that, the semiconductor substrate 10 is removed from the annealing apparatus 75.

Note that if a high-dielectric-constant film is deposited as a tunnel insulating film, the densifying process described above may also be applied to this tunnel insulating film.

As shown in FIGS. 4A and 4B, CVD is performed to deposit a conductive layer 80 about 100 nm thick which has a two-layered structure including, e.g., a polysilicon layer and tungsten (W) silicide layer, and which serves as a control gate electrode later, and to deposit a mask material 90.

The mask material 90, conductive layer 80, alumina ($Al_2O_3$) film 70, polysilicon layer 30, and silicon oxynitride (SiON) film 20 are sequentially patterned by lithography and RIE, thereby forming a slit 100. In this manner, a floating gate electrode made of the polysilicon layer 30 and a control gate electrode made of the conductive layer 80 are formed.

As shown in FIGS. 5A and 5B, a silicon oxide film 100 serving as an electrode sidewall insulating film is formed by thermal oxidation on the exposed surfaces of the semiconductor substrate 10, silicon oxynitride (SiON) film 20, polysilicon layer 30, alumina ($Al_2O_3$) film 70, conductive layer 80, and mask material 90. After that, a source region 110A and drain region 110B are formed by ion implantation, and an interlayer dielectric film 120 is formed on the entire surface of the silicon oxide film 100 by CVD. Finally, interconnecting layers (not shown) and the like are formed to fabricate the memory cell transistor of the NAND flash memory.

FIG. 6A shows the longitudinal section when a NAND flash memory 200 in which memory cell transistors MC fabricated by the above method are arranged in a matrix is cut along a bit line BL. FIG. 6B shows the circuit diagram, which corresponds to the longitudinal section shown in FIG. 6A, of the NAND flash memory 200.

In the NAND flash memory 200 as shown in FIGS. 6A and 6B, the source regions 110A and drain regions 110B of a plurality of memory cell transistors MC are connected in series between two selection transistors (not shown), one of these selection transistors is connected to the bit line BL, and the other is connected to a source line (not shown). Also, a word line WL is connected to the control gate electrode made of the conductive layer 80 of each memory cell transistor MC.

In this embodiment, the NAND flash memory 200 is fabricated as a flash memory. However, it is also possible to fabricate any of various flash memories having a structure in which a floating gate electrode and control gate electrode, e.g., NOR and AND are stacked. Furthermore, a structure including three or more stacked layers each made up of an insulating film and gate electrode may also be formed.

Figure 8B:
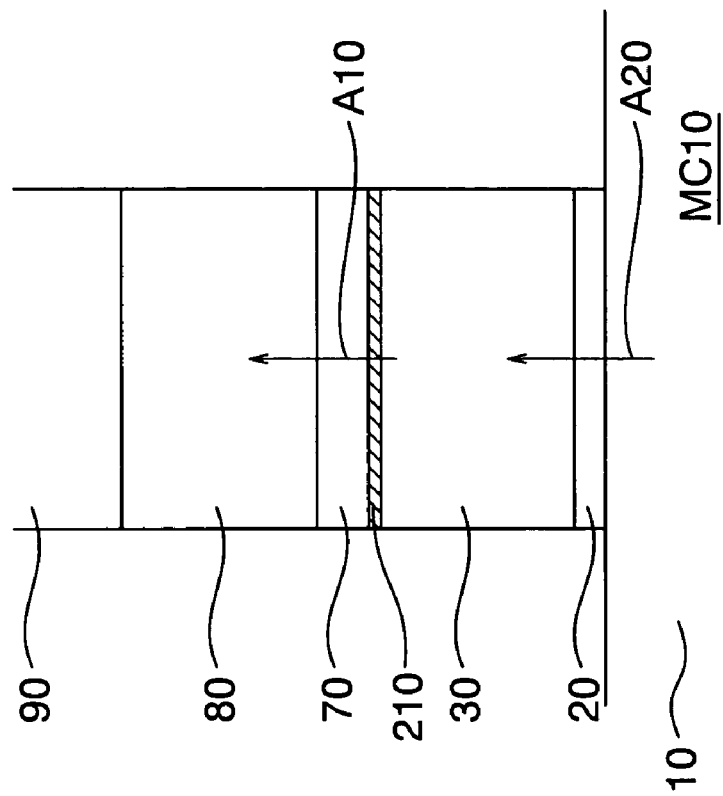
FIGS. 8A and 8B are longitudinal sectional views showing the sectional structure of a memory cell transistor according to the first embodiment of the present invention and that of a memory cell transistor of a comparative example.
Figure 8A:
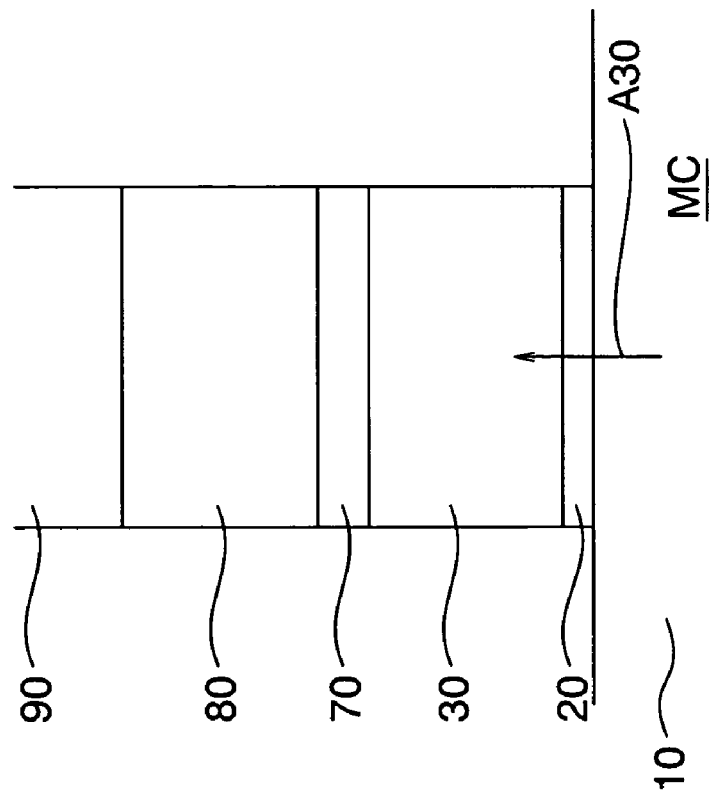

FIG. 8A shows the structure of the memory cell transistor MC of the NAND flash memory 200 according to this embodiment. FIG. 8B shows the structure of a memory cell transistor MC10 as a comparative example. In the memory cell transistor MC10, an alumina ($Al_2O_3$) film 70 is not densified after being deposited, but densified after being exposed to the atmosphere, thereby forming a low-dielectric-constant silicon oxide film 210 in the interface between a floating gate electrode made of a polysilicon layer 30 and an inter-electrode insulating film made of the alumina ($Al_2O_3$) film 70.

The memory cell transistor MC10 of the comparative example has the problem that the effective relative dielectric constant of the inter-electrode insulating film lowers, since the low-dielectric-constant silicon oxide film 210 is formed in the interface between the floating gate electrode made of the polysilicon layer 30 and the inter-electrode insulating film made of the alumina ($Al_2O_3$) film 70.

By contrast, in this embodiment, in the deposition/modification apparatus 65, the alumina ($Al_2O_3$) film 70 is densified, after being deposited and before being exposed to the atmosphere, to such an extent that moisture absorption by the alumina ($Al_2O_3$) film 70 can be suppressed. Accordingly, even when the alumina ($Al_2O_3$) film 70 is densified in the annealing apparatus 75 to such an extent that the leakage current in the alumina ($Al_2O_3$) film 70 can be suppressed, it is possible to prevent the formation of the low-dielectric-constant silicon oxide film 210 in the interface between the polysilicon layer 30 and alumina ($Al_2O_3$) film 70. This makes it possible to suppress the lowering of the effective relative dielectric constant of the alumina ($Al_2O_3$) film 70 as a high-dielectric-constant film.

Also, as shown in FIG. 8B, if the low-dielectric-constant silicon oxide film 210 is formed in the interface between the polysilicon layer 30 and alumina ($Al_2O_3$) film 70 as in the memory cell transistor MC10 of the comparative example, the existence of the silicon oxide film 210 increases the leakage current (an arrow A10 in FIG. 8B) in the alumina ($Al_2O_3$) film 70 as an inter-electrode insulating film.

That is, when an electric field of a predetermined level is applied between a conductive layer 80 as the control gate electrode and a semiconductor substrate 10 to inject electrons (an arrow A20 in FIG. 8B) from the semiconductor substrate 10 into the polysilicon layer 30 as the floating gate electrode, these electrons injected into the polysilicon layer 30 penetrate through the silicon oxide film 210 and alumina ($Al_2O_3$) film 70, and increase the leakage current (the arrow A10 in FIG. 8B) flowing through the conductive layer 80.

Conversely, in this embodiment as shown in FIG. 8A, it is possible to prevent the formation of the low-dielectric-constant silicon oxide film 210 in the interface between the polysilicon layer 30 and alumina ($Al_2O_3$) film 70. Therefore, even when an electric field of a predetermined level is applied between the conductive layer 80 and semiconductor substrate 10 to inject electrons (an arrow A30 in FIG. 8A) from the semiconductor substrate 10 into the polysilicon layer 30, a leakage current in the alumina ($Al_2O_3$) film 70 can be suppressed.

Figure 9:
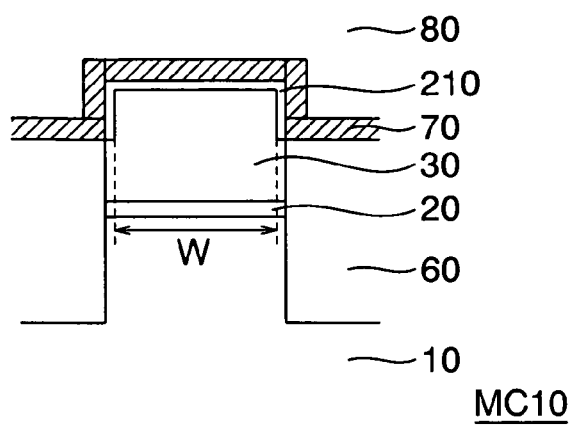
FIG. 9 is a longitudinal sectional view showing the sectional structure of a floating gate electrode and vicinity in the memory cell transistor of the comparative example.

Also, as shown in FIG. 9, in the memory cell transistor MC10 of the comparative example, the silicon oxide film 210 is formed into an inverse U-shape along the interface between the polysilicon layer 30 as the floating gate electrode and the alumina ($Al_2O_3$) film 70 as the inter-electrode insulating film.

When a length W in the direction of the word line WL of the surface of the polysilicon layer 30 shortens by the film thickness of the silicon oxide film 210, the surface area of the polysilicon layer 30 reduces. As a consequence, the capacitance of the capacitor between the conductive layer 80 and polysilicon layer 30 decreases.

This causes the necessity of the higher voltage applied to the conductive layer 80 as the control gate electrode to inject electrons from the semiconductor substrate 10 into polysilicon layer 30 as the floating gate electrode, and then the larger electric filed is applied between the conductive layer 80 and polysilicon layer 30.

Recently, the dimension (i.e., the channel width) W in the direction of the word line WL of the surface of the polysilicon layer 30 is set to 100 nm or less, and desirably, 50 nm or less, by the decrease in cell size.

Accordingly, when the silicon oxide film 210 is formed along the interface between the polysilicon layer 30 and alumina ($Al_2O_3$) film 70, the influence the silicon oxide film 210 has on the surface area of the polysilicon layer 30 increases, so the memory cell transistor characteristics largely change.

On the contrary, in this embodiment, it is possible to prevent the formation of the silicon oxide film 210 along the interface between the polysilicon layer 30 and alumina ($Al_2O_3$) film 70. This suppresses the change in memory cell transistor characteristics.

Figure 10:
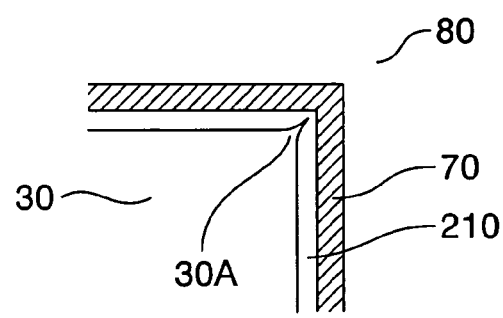
FIG. 10 is a longitudinal sectional view showing the sectional structure of the corner and vicinity at the upper end of the floating gate electrode in the memory cell transistor of the comparative example.

Also, as shown in FIG. 10, when the silicon oxide film 210 is formed into an inverse U-shape along the interface between the polysilicon layer 30 as the floating gate electrode and the alumina ($Al_2O_3$) film 70 as the inter-electrode insulating film as in the memory cell transistor MC10 of the comparative example, a corner 30A at the upper end of the polysilicon layer 30 is pointed because the oxidation rate is low in this portion.

When, therefore, a high electric field is applied between the conductive layer 80 as the control gate electrode and the polysilicon layer 30 as the floating gate electrode, field concentration occurs in the corner 30A at the upper end of the polysilicon layer 30 because the corner 30A is pointed. This allows easy occurrence of insulation breakdown.

By contrast, in this embodiment, it is possible to prevent the formation of the silicon oxide film 210 along the interface between the polysilicon layer 30 and alumina ($Al_2O_3$) film 70. This prevents the occurrence of insulating breakdown caused by field concentration in the corner 30A at the upper end of the polysilicon layer 30.

Furthermore, to prevent the formation of a depletion layer when an electric field is applied, the polysilicon layer 30 serving as the floating gate electrode is formed such that the impurity concentration of, e.g., phosphorus (P) doped is as high as, e.g., $1.0 \times 10^{20}/cm^3$ or more.

In this case, if the silicon oxide film 210 having a high impurity concentration is formed in the interface between the polysilicon layer 30 and alumina ($Al_2O_3$) film 70 as in the memory cell transistor MC10 of the comparative example, the leakage current in the alumina ($Al_2O_3$) film 70 as an electrode insulating film increases compared to the case in which a silicon oxide film having a low impurity concentration is formed.

In contrast to this, in this embodiment, it is possible to prevent the formation of the silicon oxide film 210 having a high impurity concentration in the interface between the polysilicon layer 30 and alumina ($Al_2O_3$) film 70. This suppresses the increase of the leakage current in the alumina ($Al_2O_3$) film 70 as an electrode insulating film.

Figure 11:
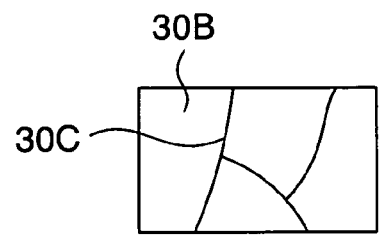
FIG. 11 is a longitudinal sectional view showing the sectional structure of the floating gate electrode in the memory cell transistor.
Figure 12:
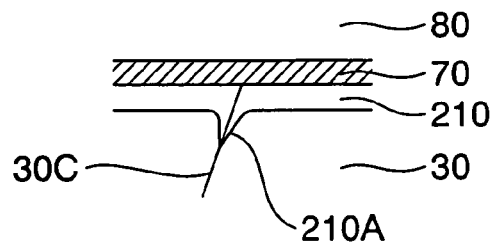
FIG. 12 is a longitudinal sectional view showing the sectional structure of the interface and vicinity between the floating gate electrode and an inter-electrode insulating film in the memory cell transistor of the comparative example.

Also, as shown in FIG. 11, the polysilicon layer 30 as the floating gate electrode is made of polysilicon having a plurality of single-crystal grains 30B. Therefore, as shown in FIG. 12, when the silicon oxide film 210 is formed in the interface between the polysilicon layer 30 and alumina ($Al_2O_3$) film 70 as in the memory cell transistor MC10 of the comparative example, oxygen diffuses along a grain boundary 30C. Consequently, a projecting portion 210A which sharply projects along the grain boundary 30C is formed on the silicon oxide film 210.

Accordingly, when an electric field is applied between the conductive layer 80 as the control gate electrode and the polysilicon layer 30 as the floating gate electrode, field concentration occurs in the projecting portion 210A of the silicon oxide film 210, and this increases the leakage current.

On the contrary, in this embodiment, it is possible to prevent the formation of the silicon oxide film 210 in the interface between the polysilicon layer 30 and alumina ($Al_2O_3$) film 70. This suppresses the increase of the leakage current caused by field concentration near the grain boundary 30C of the single-crystal grains 30B.

Note that the first embodiment described above is merely an example, and hence does not limit the present invention. For example, in the batch type deposition/modification apparatus 65 called a furnace, the alumina ($Al_2O_3$) film 70 is deposited, and annealing is performed to suppress moisture absorption by the alumina ($Al_2O_3$) film 70. However, it is also possible to perform deposition of the alumina ($Al_2O_3$) film 70 and annealing for suppressing moisture absorption in a single-wafer type deposition/modification apparatus 220 called a cluster chamber shown in FIG. 13.

A transfer chamber 230 is placed near the central portion of the deposition/modification apparatus 220 as a processing chamber called a cluster chamber. A loading chamber 240, an unloading chamber 250, a deposition chamber 260 as a processing vessel, and an annealing chamber 270 as another processing vessel are arranged around the transfer chamber 230.

A transfer mechanism 280 which is an arm or the like is placed near the central portion of the transfer chamber 230, and transfers the semiconductor substrate 10 between the chambers 240 to 270. Also, the transfer chamber 230 has an exhausting mechanism and gas supply source (neither is shown), and a desired ambient is formed in the transfer chamber 230 by using them. In this manner, the semiconductor substrate 10 can be transferred to a desired chamber without being exposed to the atmosphere.

That is, the transfer mechanism 280 of the transfer chamber 230 transfers the semiconductor substrate 10 loaded from the loading chamber 240 to the deposition chamber 260, and an alumina ($Al_2O_3$) film 70 is deposited in the deposition chamber 260. After that, the semiconductor substrate 10 is transferred from the deposition chamber 260 to the annealing chamber 270 via the transfer chamber 230. In the annealing chamber 270, the alumina ($Al_2O_3$) film 70 is densified by annealing to such an extent that moisture absorption by the alumina ($Al_2O_3$) film 70 can be suppressed.

Then, the semiconductor substrate 10 is transferred from the annealing chamber 270 to the unloading chamber 250 via the transfer chamber 230, and thereby removed from the deposition/modification apparatus 220. The semiconductor substrate 10 is loaded into an annealing apparatus 290 shown in FIG. 13. Although the semiconductor substrate 10 is exposed to the atmosphere during this transfer as in the above first embodiment, moisture absorption by the alumina ($Al_2O_3$) film 70 can be suppressed.

In the annealing apparatus 290, the alumina ($Al_2O_3$) film 70 is densified by annealing at a high temperature to such an extent that the leakage current in the alumina ($Al_2O_3$) film 70 can be suppressed.

(2) Second Embodiment

Figure 14:
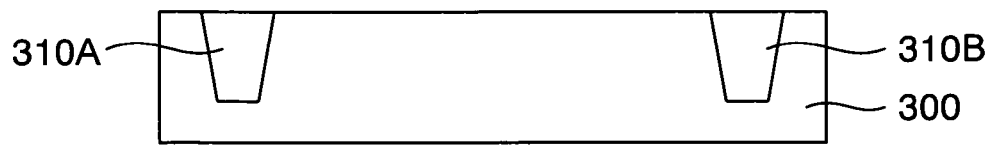
FIG. 14 is a longitudinal sectional view showing the sectional structure of elements in a predetermined step of a method of fabricating a MOSFET according to the second embodiment of the present invention.

FIGS. 14 to 18 show a method of fabricating a MOSFET according to the second embodiment of the present invention. First, as shown in FIG. 14, element isolation insulating films 310A and 310B are formed on a semiconductor substrate 300, and a natural oxide film formed on the semiconductor substrate 300 is removed by cleaning using dilute hydrofluoric acid.

Figure 15:
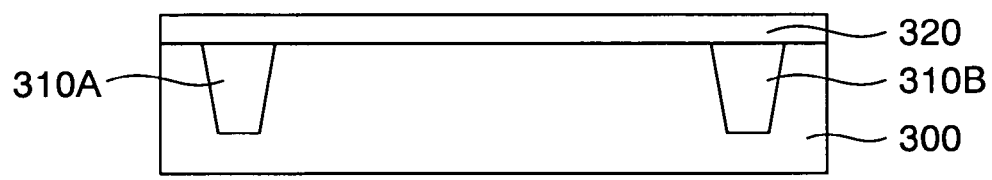
FIG. 15 is longitudinal sectional views each showing the sectional structure of elements in one step of the method of fabricating the MOSFET.

As shown in FIG. 15, the semiconductor substrate 300 is loaded into a batch type deposition/modification apparatus 65 shown in FIG. 7 which is a processing chamber having a single processing vessel and is called a furnace. In the deposition/modification apparatus 65, a hafnia (HfO$_2$) film 320 serving as a gate insulting film is deposited on the surface of the semiconductor substrate 300 at a temperature of 400° C. Note that the deposition/modification apparatus 65 has an exhausting mechanism and gas supply source (neither is shown), and can form a desired ambient by using them.

In this embodiment, the hafnia (HfO$_2$) film 320 is deposited as a gate insulating film. However, it is also possible to deposit any of various high-dielectric-constant films having a relative dielectric constant of 4 or more. Examples are oxide films such as alumina (Al$_2$O$_3$), zirconia (ZrO$_2$), hafnium silicate (HfSiO), and zirconium silicate (ZrSiO), and oxide films obtained by doping an impurity into these oxide films.

As in the first embodiment, in the deposition/modification apparatus 65 in which the hafnia (HfO$_2$) film 320 is deposited, the hafnia (HfO$_2$) film 320 is densified by annealing in a nitrogen ambient at a temperature of, e.g., 800° C., to such an extent that the hafnia (HfO$_2$) film 320 does not absorb water when the semiconductor substrate 300 is exposed to the atmosphere.

Note that, as in the first embodiment, the temperature of this annealing need only be, e.g., 600° C. to 900° C. which is higher than the temperature when the hafnia (HfO$_2$) film 320 is deposited. However, the temperature is desirably as high as possible because the densifying effect increases. Annealing may also be performed in an oxidizing ambient.

After that, the semiconductor substrate 300 is removed from the deposition/modification apparatus 65, and loaded into an annealing apparatus 75 shown in FIG. 7. Although the semiconductor substrate 300 is exposed to the atmosphere during this transfer, it is possible to suppress the hafnia (HfO$_2$) film 320 from absorbing water, i.e., suppress moisture absorption by the hafnia (HfO$_2$) film 320.

In the annealing apparatus 75, the hafnia (HfO$_2$) film 320 is annealed in an oxidizing ambient at, e.g., about 1,000° C. which is higher than the temperature of annealing for suppressing moisture absorption by the hafnia (HfO$_2$) film 320, without performing any liquid chemical treatment, thereby densifying the hafnia (HfO$_2$) film 320 to such an extent that the leakage current in the hafnia (HfO$_2$) film 320 can be suppressed. After that, the semiconductor substrate 300 is removed from the annealing apparatus 75.

Figure 16:
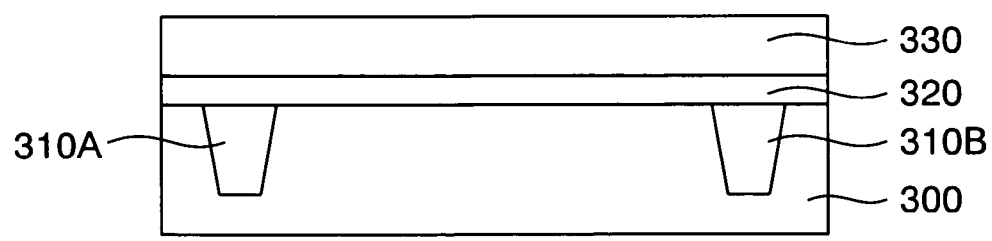
FIG. 16 is longitudinal sectional views each showing the sectional structure of elements in one step of the method of fabricating the MOSFET.
Figure 17:
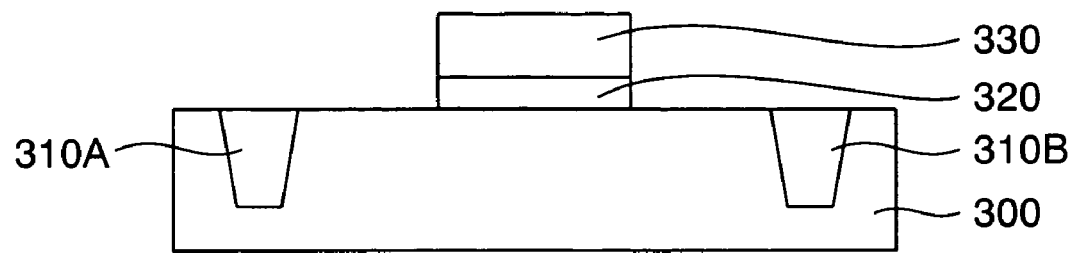
FIG. 17 is longitudinal sectional views each showing the sectional structure of elements in one step of the method of fabricating the MOSFET.
Figure 18:
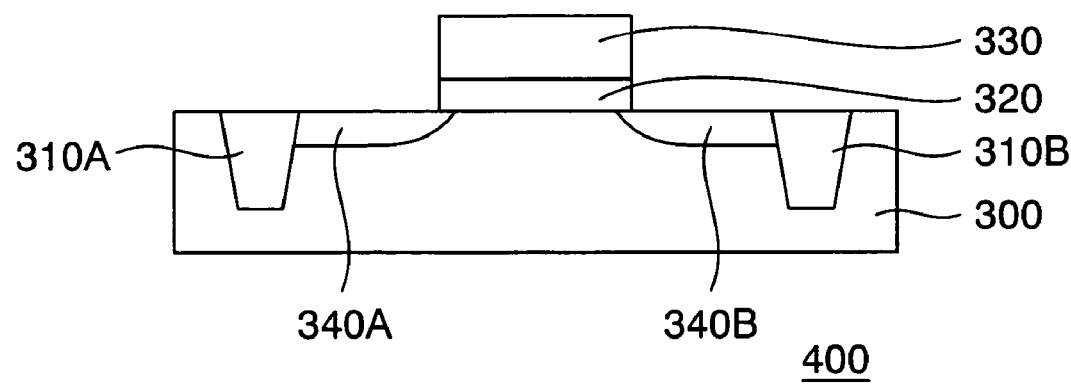
FIG. 18 is longitudinal sectional views each showing the sectional structure of elements in one step of the method of fabricating the MOSFET.

As shown in FIG. 16, CVD is performed to deposit a polysilicon layer 330 serving as a gate electrode. As shown in FIG. 17, the polysilicon layer 330 and hafnia (HfO$_2$) film 320 are sequentially patterned by lithography and RIE, thereby forming a gate insulating film made of the hafnia (HfO$_2$) film 320, and a gate electrode made of the polysilicon layer 330. As shown in FIG. 18, a source region 340A and drain region 340B are formed by ion implantation. In this manner, a MOSFET 400 is fabricated.

Figure 19B:
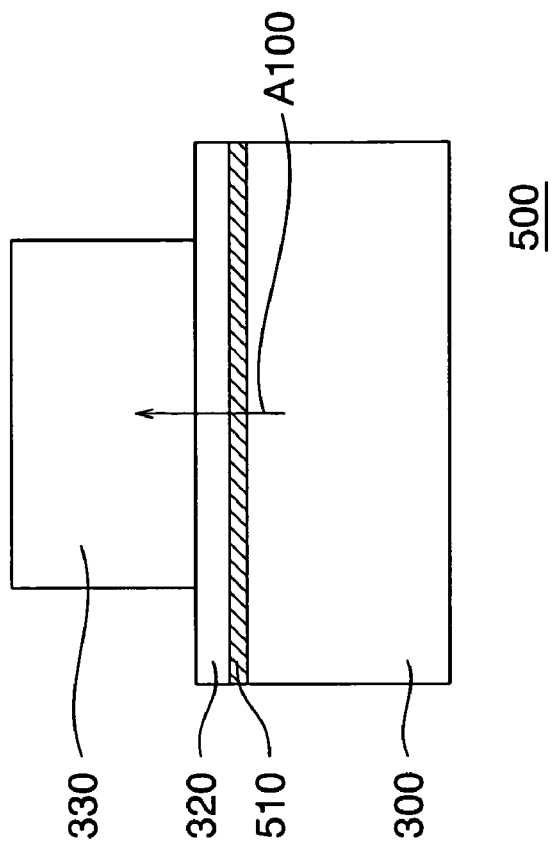
FIGS. 19A and 19B are longitudinal sectional views showing the sectional structure of the MOSFET according to the second embodiment of the present invention and that of a MOSFET of a comparative example.
Figure 19A:
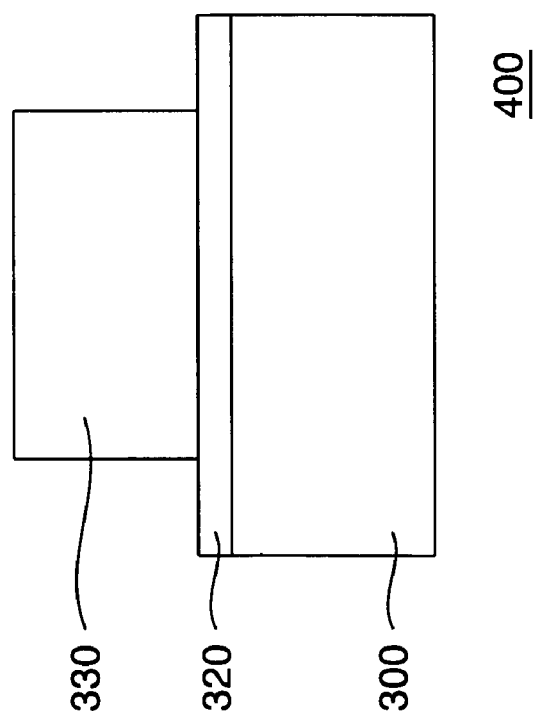

FIG. 19A shows the structure of the MOSFET 400 according to this embodiment. FIG. 19B shows the structure of a MOSFET 500 as a comparative example. In the MOSFET 500, a hafnia (HfO$_2$) film 320 is not densified after being deposited, but densified after being exposed to the atmosphere, thereby forming a low-dielectric-constant silicon oxide film 510 in the interface between a gate insulating film made of the hafnia (HfO$_2$) film 320 and a semiconductor substrate 300.

The MOSFET 500 of the comparative example has the problem that the effective relative dielectric constant of the gate insulating film lowers, since the low-dielectric-constant silicon oxide film 510 is formed in the interface between the gate insulating film made of the hafnia (HfO$_2$) film 320 and the semiconductor substrate 300.

By contrast, in this embodiment, as in the first embodiment, the hafnia (HfO$_2$) film 320 is densified in the deposition/modification apparatus 65, after being deposited and before being exposed to the atmosphere, to such an extent that moisture absorption by the hafnia (HfO$_2$) film 320 can be suppressed. Accordingly, even when the hafnia (HfO$_2$) film 320 is densified in the annealing apparatus 75 to such an extent that the leakage current in the hafnia (HfO$_2$) film 320 can be suppressed, it is possible to prevent the formation of the low-dielectric-constant silicon oxide film 510 in the interface between the hafnia (HfO$_2$) film 320 and semiconductor substrate 300. This makes it possible to suppress the lowering of the effective relative dielectric constant of the hafnia (HfO$_2$) film 320 as a high-dielectric-constant film.

Also, as shown in FIG. 19B, if the low-dielectric-constant silicon oxide film 510 is formed in the interface between the hafnia (HfO$_2$) film 320 and semiconductor substrate 300 as in the MOSFET 500 of the comparative example, the existence of the silicon oxide film 510 increases the leakage current (an arrow A100 in FIG. 19B) in the hafnia (HfO$_2$) film 320 as a gate insulating film.

That is, when an electric field of a predetermined level is applied between the polysilicon layer 330 as the gate electrode and the semiconductor substrate 300 to draw electrons toward the surface of the semiconductor substrate 300, these drawn electrons penetrate through the silicon oxide film 510 and hafnia (HfO$_2$) film 320, and increase the leakage current (the arrow A100 in FIG. 19B) flowing through the polysilicon layer 330.

Conversely, in this embodiment as shown in FIG. 19A, it is possible to prevent the formation of the low-dielectric-constant silicon oxide film 510 in the interface between the hafnia (HfO$_2$) film 320 and semiconductor substrate 300. Therefore, the leakage current in the hafnia (HfO$_2$) film 320 can be suppressed.

Note that the second embodiment described above is merely an example, and hence does not limit the present invention. For example, in the batch type deposition/modification apparatus 65 called a furnace, the hafnia (HfO$_2$) film 320 is deposited, and annealing is performed to suppress moisture absorption by the hafnia (HfO$_2$) film 320. However, as in the other embodiment of the first embodiment, it is also possible to perform deposition of the hafnia (HfO$_2$) film 320 and annealing for suppressing moisture absorption in a single-wafer type deposition/modification apparatus 220 called a cluster chamber shown in FIG. 13.

Figure 13:
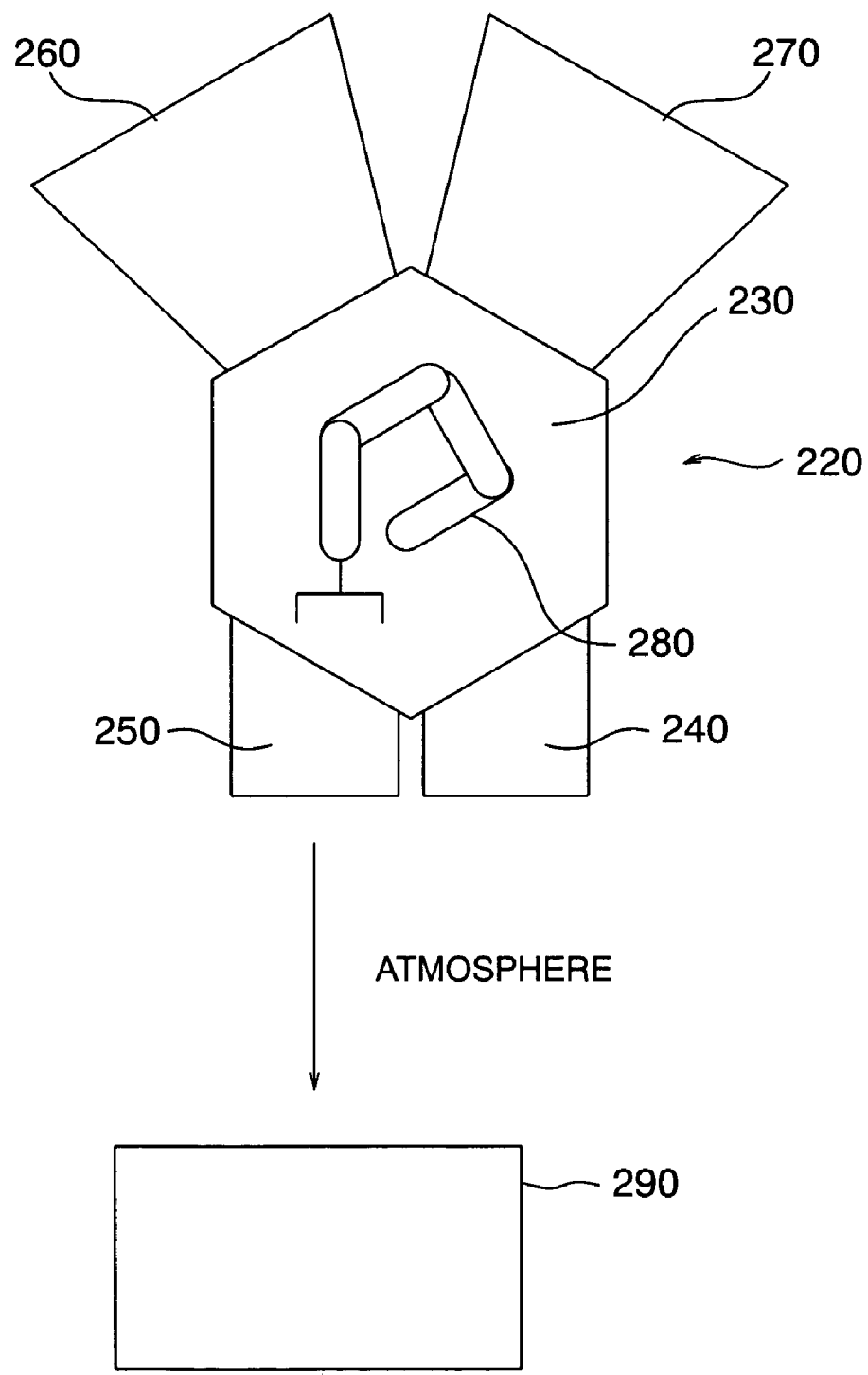
FIG. 13 is a block diagram showing the arrangement of a single-wafer deposition/modification apparatus and annealing apparatus.

In this case, as in the other embodiment of the first embodiment, the semiconductor substrate 300 is removed from the deposition/modification apparatus 220 which is a processing chamber having a plurality of processing vessels, and loaded into an annealing apparatus 290 shown in FIG. 13. Although the semiconductor substrate 300 is exposed to the atmosphere during this transfer, moisture absorption by the hafnia (HfO$_2$) film 320 can be suppressed.

In the annealing apparatus 290, the hafnia (HfO$_2$) film 320 is densified by annealing at a high temperature to such an extent that the leakage current in the hafnia (HfO$_2$) film 320 can be suppressed.

(3) Other Embodiments

Note that the first and second embodiments described above are merely examples, and hence do not limit the present invention. For example, oxygen radical processing may also be performed at a temperature of 400° C. as the modification process of suppressing moisture absorption by the alumina ($Al_2O_3$) film 70 and hafnia ($HfO_2$) film 320. In this case, although the temperature need only range from room temperature to 900° C., the temperature is desirably as high as possible because the modification effect improves.

The oxygen radical is, e.g., neutral atomic oxygen or excited molecular oxygen, and is generated by changing a gas mixture, which is obtained by diluting oxygen gas to 1% to 100% with argon gas, into plasma by microwaves. The alumina ($Al_2O_3$) film 70 and hafnia ($HfO_2$) film 320 are modified by oxygen radical processing which causes the alumina ($Al_2O_3$) film 70 and hafnia ($HfO_2$) film 320 to absorb this oxygen radical.

Note that this oxygen radical processing may also be performed in an ambient in which the oxygen radical and oxygen ion are mixed. It is also possible to dilute oxygen gas with any of various diluent gases such as helium, neon, krypton, and xenon. Furthermore, the ratio of oxygen gas may also be increased by reducing the amount diluted by the diluent gas, or the ratio of oxygen gas may also be set at $100$% without any dilution by the diluent gas.

Although hydrogen gas may also be added to the gas mixture, the addition amount is preferably as low as 1% to 10%. The gas mixture may also be changed into plasma by a high frequency, NO gas, or $N_2O$ gas, instead of microwaves. The oxygen radical may also be generated by the reaction of oxygen gas with hydrogen gas.

Nitrogen radical processing may also be performed by generating nitrogen radical by changing a gas mixture of nitrogen gas and a diluent gas or 100% nitrogen gas into plasma by the same method as for generating the oxygen radical. It is also possible to simultaneously perform the oxygen radical processing and nitrogen radical processing by simultaneously generating the oxygen radical and nitrogen radical by changing a gas mixture of oxygen gas and nitrogen gas into plasma.

Furthermore, as the modification process of suppressing moisture absorption by the alumina ($Al_2O_3$) film 70 and hafnia ($HfO_2$) film 320, it is also possible to perform an ultraviolet radiation process of irradiating the alumina ($Al_2O_3$) film 70 and hafnia ($HfO_2$) film 320 with ultraviolet light in a nitrogen ambient at room temperature.

Note that a light radiation process of radiating any of various types of light such as visible light, infrared light, and white light may also be performed.

In this case, a point light source is placed above the semiconductor substrates 10 and 300, and the semiconductor substrates 10 and 300 are irradiated, by uniform intensity, with light emitted from this point light source by using a light reflecting plate. It is also possible to arrange a plurality of light sources over the semiconductor substrates 10 and 300, and irradiate the semiconductor substrates 10 and 300, by uniform intensity, with light emitted from these light sources.

Although the temperature need only range from room temperature to 900° C., the temperature is desirably as high as possible because the modification effect improves. The light radiation process may also be performed in an oxygen ambient or in a vacuum, instead of a nitrogen ambient.

As has been explained above, the semiconductor device fabrication method of each of the above embodiments can improve the reliability of the semiconductor device by suppressing the leakage current.

The invention claimed is:

1. A semiconductor device fabrication method comprising:
   forming a first insulating film on a semiconductor substrate;
   forming a first conductive layer on the first insulating film;
   forming a second insulating film on the first conductive layer in a first processing chamber isolated from an outside;
   performing a modification process on the second insulating film in the first processing chamber, and unloading the semiconductor substrate from the first processing chamber to the outside;
   annealing the second insulating film in a second processing chamber;
   forming a second conductive layer on the second insulating film; and
   patterning the first conductive layer and first insulating film, and etching to remove an exposed portion of the semiconductor substrate by a predetermined depth, thereby forming a trench such that a width of a projecting portion formed in a surface portion of the semiconductor substrate is not more than 100 nm.

2. A method according to claim 1, wherein the first processing chamber comprises a single processing vessel.

3. A method according to claim 1, wherein a relative dielectric constant of the second insulating film is not less than 4.

4. A method according to claim 1, wherein the modification process is a process performed by annealing performed at a temperature not less than a temperature when the second insulating film is formed, oxygen radical and/or nitrogen radical processing, or a light radiation process.

5. A method according to claim 1, further comprising, patterning the first conductive layer and first insulating film, and etching to remove an exposed portion of the semiconductor substrate by a predetermined depth, thereby forming a trench such that a width of a projecting portion formed in a surface portion of the semiconductor substrate is not more than 50 nm.

6. A method according to claim 1, further comprising: patterning the first conductive layer and first insulating film, and etching away an exposed portion of the semiconductor substrate by a predetermined depth, thereby forming a trench; filling the trench with a third insulating film; and etching to remove a predetermined amount of a surface portion of the third insulating film to expose an upper portion of a side surface of the first conductive layer, which is in contact with the third insulating film, wherein when the second insulating film is formed, the second insulating film is formed on the first conductive layer and third insulating film.

7. A method according to claim 1, wherein when the first conductive layer is formed, the first conductive layer is formed by depositing a polycrystalline semiconductor material.

8. A method according to claim 1, further comprising: forming a control gate electrode, inter-electrode insulating film, floating gate electrode, and tunnel insulating film by sequentially patterning the second conductive layer, second insulating film, first conductive layer, and first insulating film; and forming a source region and drain region by ion-implanting a predetermined impurity into a surface portion of the semiconductor substrate.

9. A method according to claim 1, wherein the semiconductor device is a NAND flash memory.

10. A semiconductor device fabrication method comprising:
    forming a first insulating film on a semiconductor substrate;

forming a first conductive layer on the first insulating film;

forming a second insulating film on the first conductive layer in a first processing chamber isolated from an outside;

performing a modification process on the second insulating film in the first processing chamber, and unloading the semiconductor substrate from the first processing chamber to the outside;

annealing the second insulating film in a second processing chamber; and forming a second conductive layer on the second insulating film;

wherein when the first conductive layer is formed, the first conductive layer whose impurity concentration is not less than $1.0 \times 10^{20}/cm^3$ is formed.

11. A method according to claim 10, wherein the first processing chamber comprises a single processing vessel.

12. A method according to claim 10, wherein a relative dielectric constant of the second insulating film is not less than 4.

13. A method according to claim 10, wherein the modification process is a process performed by annealing performed at a temperature not less than a temperature when the second insulating film is formed, oxygen radical and/or nitrogen radical processing, or a light radiation process.

14. A method according to claim 10, further comprising:

patterning the first conductive layer and first insulating film, and etching to remove an exposed portion of the semiconductor substrate by a predetermined depth, thereby forming a trench such that a width of a projecting portion formed in a surface portion of the semiconductor substrate is not more than 50 nm.

15. A method according to claim 10, further comprising:

patterning the first conductive layer and first insulating film, and etching away an exposed portion of the semiconductor substrate by a predetermined depth, thereby forming a trench;

filling the trench with a third insulating film; and etching to remove a predetermined amount of a surface portion of the third insulating film to expose an upper portion of a side surface of the first conductive layer, which is in contact with the third insulating film;

wherein when the second insulating film is formed, the second insulating film is formed on the first conductive layer and third insulating film.

16. A method according to claim 10, wherein when the first conductive layer is formed, the first conductive layer is formed by depositing a polycrystalline semiconductor material.

17. A method according to claim 10, further comprising:

forming a control gate electrode, inter-electrode insulating film, floating gate electrode, and tunnel insulating film by sequentially patterning the second conductive layer, second insulating film, first conductive layer, and first insulating film; and forming a source region and drain region by ion-implanting a predetermined impurity into a surface portion of the semiconductor substrate.

18. A method according to claim 10, wherein the semiconductor device is a NAND flash memory.

* * * * *